(12) United States Patent
Harnack et al.

(10) Patent No.: US 8,137,569 B2
(45) Date of Patent: Mar. 20, 2012

(54) METHOD OF FABRICATING A MEMBRANE HAVING A TAPERED PORE

(75) Inventors: Oliver Harnack, Stuttgart (DE); Jurina Wessels, Starnberg (DE); Akio Yasuda, Tokyo (JP); James Clarke, Colchester (GB); Terry Reid, Bicester (GB)

(73) Assignees: Sony Deutschland GmbH, Berlin (DE); Oxford Nanopore Technologies Limited, Kidlington (GB)

( * ) Notice: Subject to any disclaimer, the term of this patent is extended or adjusted under 35 U.S.C. 154(b) by 379 days.

(21) Appl. No.: 12/409,007

(22) Filed: Mar. 23, 2009

(65) Prior Publication Data

US 2009/0274870 A1    Nov. 5, 2009

(30) Foreign Application Priority Data

Mar. 31, 2008   (EP) .................................. 08006456

(51) Int. Cl.
*B81C 1/00* (2006.01)
*B01D 67/00* (2006.01)

(52) U.S. Cl. .................. 216/2; 216/41; 216/47; 216/49; 216/56; 216/67; 216/83; 216/100; 204/192.1; 204/192.15; 204/192.34; 205/157; 205/162; 205/164; 264/320; 430/320

(58) Field of Classification Search ..................... 216/56
See application file for complete search history.

(56) References Cited

U.S. PATENT DOCUMENTS

| | | | | |
|---|---|---|---|---|
| 5,635,337 A | * | 6/1997 | Bartha et al. | 430/323 |
| 6,555,479 B1 | * | 4/2003 | Hause et al. | 438/706 |
| 6,577,010 B2 | * | 6/2003 | Batra et al. | 257/751 |

FOREIGN PATENT DOCUMENTS

EP    1 721 657 A1    11/2006

* cited by examiner

*Primary Examiner* — Anita Alanko
(74) *Attorney, Agent, or Firm* — Oblon, Spivak, McClelland, Maier & Neustadt, L.L.P.

(57) ABSTRACT

A method of fabricating a membrane having a tapered pore, a polymeric membrane having a tapered pore, and uses of such polymeric membrane are disclosed. The membrane includes apertures of increasing diameter which are aligned with each other to form the tapered pore.

23 Claims, 19 Drawing Sheets

4.5μm wide, tapered aperture in a 1.5μm thick SU8 membrane

Aspect Ratio R ~ 3:1

Figure 11a

Roughness - Contact Angle Relation of CHF3/Ar Plasma-Treated SU8

| Treatment | Contact Angle - before etching | Contact Angle (averaged) - after etching | AFM Roughness (Ra) |
|---|---|---|---|
| 1 min CHF3/Ar | < 15° | 102° | 1.2 nm |
| 3 min CHF3/Ar | < 15° | 104° | 1.0 nm |
| 5 min CHF3/Ar | < 30° | 100° | 2.5 nm |
| 10 min CHF3/Ar | < 30° | 113° | 3.24 nm |

Figure 12a

Roughness - Contact Angle Relation
of CHF3/CF4 Plasma-Treated SU8

| Treatment | Contact angle – prior etching | Contact angle (averaged) – after etching | AFM Roughness (Ra) |
|---|---|---|---|
| 1 min CHF3/CF4 | < 15° | 108° | 0.8 nm |
| 5 min CHF3/CF4 | < 30° | 120° | 3.4 nm |
| 10 min CHF3/CF4 | < 30° | 115° | 2.01 nm |

SONY MSL

METHOD OF FABRICATING A MEMBRANE HAVING A TAPERED PORE

BACKGROUND OF THE INVENTION

Field of the Invention

The present invention relates to a method of fabricating a membrane having a tapered pore, to a polymeric membrane having a tapered pore and to uses of such polymeric membrane.

Suspended bilayers are usually formed across a solid support that contains an aperture/pore. It is known that the area of the aperture/pore across which the bilayer spans, influences the stability of the bilayer. On the one hand, the smaller the area is, the longer the bilayer generally stays stable. On the other hand, the smaller the area of the bilayer is, the longer it takes to introduce a pore protein into the suspended part of the formed bilayer.

In order to form the bilayer, the two sides of the membranes are usually brought into contact with liquids, which contain the components of the bilayer. While the liquid is applied on one side, the liquid on the other side of the membrane is usually flowed across the aperture/pore. This procedure leads to the spontaneous formation of a lipid bilayer across the aperture within a single trial or after several trials.

A number of research groups have studied suitable solid supports for lipid bilayer formation.
1) Dogan et al. claimed a silicon/silicon oxide support or a polyimide support that contains an circular aperture with diameters in the range between 1 µm and 50 µm. The aspect ratio between aperture diameter and membrane thickness as well as the surface treatment was not further specified in this application.
2) Takeuchi et al. taught in a quite general way a tapered aperture that narrows continuously towards the aperture edge. Their material of choice is $Si/SiO_2$. The geometrical dimensions of the aperture and of the membranes were not specified in the claims. Details about the geometrical dimensions of the continuous taper and the surface treatment were not further specified in this application.
3) Pohl et al. reported about a lipid bilayer forming technique that utilises an aperture that is made in glass or in plastic. The diameter range they claim was 50 µm to 300 µm. No further details about aspect ratio or surface treatment were given.
4) Heath et al. filed a patent application in 2004, which describes the membrane with an apertures with diameters between 1 µm and 200 µm made from silicon wafers. They suggest that the surface of the membrane is covered with an insulating material like SiO2 or SixNy. In addition to this coverage, surface modification by silanisation is introduced in order to increase the adhesion of biological material to the membrane surface. Specific details to the shape of the aperture and the aspect ratio between aperture diameter and thickness of the membrane close to the aperture were not given.
5) Ogier et al. have published two papers in 2000 and 2001, respectively, describing the fabrication of apertures in SU8 photoresist-based membranes that were covered with an additional gold layer that could be modified by using thiol chemistry. The thickness of the central membrane was 10 µm, the aperture diameter was about 100 µm. Further considerations about the aspect ratio, especially for the case of aperture diameters smaller than 100 µm were not mentioned.

In order to support bilayers to build so-called suspended bilayers for practical device applications, solid structures with apertures are required. These usually have the shape of thin membranes that have a single or multiple openings (apertures). The membrane thickness as well as the diameter of the aperture, and the surface properties are believed to represent the major factors that influence the dynamics of forming bilayer membranes across the apertures (FIG. 1).

The aperture area influences the long-term stability of a bilayer: In general, bilayers across small area aperture are more resilient than bilayers that cover large areas.

The aspect ratio—defined as the ratio between the diameter of the aperture (d) and the membrane thickness (h)—influences the structural properties of the interface between the edges of the solid membrane and the fluid bilayer. The aperture edges should be as sharp as possible—in other words, the thickness of the membrane [at the membrane-to-bilayer transition] should be as small as possible.

This leads to the requirement of very thin membranes at the aperture edges—which need to be still mechanically stable. For example, aperture edges with conical shapes that have sharp angles are a possible solution. In contrast to this, apertures with low aspect ratios tend to have cylindrical, tube-like shapes which tend become blocked with the annulus forming organic phase or to trap air bubbles, preventing bilayer formation.

The surface properties of the membrane and specifically those of the edges of the aperture are important for the bilayer formation as well. Hydrophobic surface properties are preferable in order to support the wetting of the membrane with the hydrophobic core of the lipid bilayer.

BRIEF SUMMARY OF THE INVENTION

Accordingly, it was an object of the present invention to provide for a method of fabricating a membrane having a tapered pore which enables the formation of high aspect ratios at low aperture diameters. It was also an object of the present invention to provide for membranes that are thin and yet stable and which can be handled easily at a reduced risk of rupture. Moreover, it was an object of the present invention to provide for a cheaper manufacturing method in comparison to silicon-based membranes.

It was also an object of the present invention to provide a corresponding membrane having a tapered pore with a diameter in the range between 1 µm and 30 µm.

The objects of the present invention are solved by a method of fabricating a membrane having a tapered pore, said method comprising the steps:
 a) providing a substrate,
 b) depositing an anti-sticking layer on said substrate,
 c) depositing a first polymeric layer of a first polymeric material on said anti-sticking layer,
 d) introducing a first aperture into said first polymeric layer, said first aperture having a first diameter,
 e) depositing a second polymeric layer of a second polymeric material onto said first polymeric layer, which second polymeric layer is located on said first polymeric layer and wherein a part of said second polymeric material also extends into and fills said first aperture,
 f) introducing a second aperture into said second polymeric layer, said second aperture having a second diameter which is larger than said first diameter, said second aperture being aligned with said first aperture, such that said part of said second polymeric material, which extends into and fills said first aperture, becomes removed, g) repeating steps e) and f) n-times, thus generating a third, fourth, ... (n+2)th polymeric layer having a third, fourth, ... (n+2)th aperture in said third, fourth, ... (n+2)th polymeric layer, said third, fourth, ... (n+2)th aperture having a third, fourth, ... (n+2)th diameter which is increasingly larger with increasing n, n being an integer from 0 to 10, said method thus resulting in a polymeric membrane on an anti-sticking layer and a substrate, said polymeric membrane having a tapered pore comprising (n+2) apertures of increasing diameter, said (n+2) apertures being aligned with each other to form said tapered pore.

In one embodiment, said (n+2) apertures are concentrically aligned.

In one embodiment, said first diameter is in the range from 1 nm to 100 µm, preferably from 1 nm to 10 µm.

In one embodiment, said first polymeric layer has a height in the range from 0.3 nm to 20 µm, preferably 0.3 nm to 2 µm, and wherein said second and, if present, third, fourth, ... (n+2)th polymeric layer has a height in the range from 500 nm to 1 mm, preferably 5 µm to 50 µm.

In one embodiment, the ratio of said first diameter: height of said first polymeric layer is $\geq 3$.

Preferably, said substrate is made of a material selected from the group comprising glass, silicon, silicon oxide, silicon nitride, GaAs, saphire, polycarbide, polycarbonate.

In one embodiment, said anti-sticking layer is made of a material selected from the group comprising metals with a weak adhesion to the substrate, such as gold, silver, platinum, titanium, aluminum, alloys hereof, fluorosilanes, mica, carbon, water-soluble materials (e.g. $CaO$, $Ca(OH)_2$), heat-disposable materials and has a thickness in the range from 10 nm to 100 nm.

In one embodiment, said first, second and, if present, third, fourth, ... (n+2)th polymeric material is, independently, at each occurrence, selected from the group comprising of resists for optical lithography, electron beam lithography, and imprint lithography.

In one embodiment, step b) occurs by a method selected from evaporation, sputtering, e-gun evaporation, gas-phase-deposition, sublimation, electro-chemical deposition.

In one embodiment, steps c) and e) are independently performed by a method selected from spin coating, dip coating, spray coating, vacuum deposition, Langmuir Blodgett techniques, deposition from the gas-phase.

In one embodiment, steps d) and f) are independently performed by a method selected from optical lithography, electron beam lithography, imprint lithography, and focused ion beam etching.

In one embodiment, in steps d) and f), a plurality of first and second apertures are introduced.

Preferably, said resists for optical lithography, electron beam lithography and imprint lithography are selected from the group comprising negative and positive tone resists for optical lithography, electron beam lithography and imprint lithography.

In one embodiment, the method according to the present invention further comprises the step:
h) removing said substrate by peeling off said polymeric membrane on and together with said anti-sticking layer from said substrate.

Preferably, the method according to the present invention further comprises the step:
i) removing said anti-sticking layer by dry etching, such as dry argon-etching, $O_2$ plasma etching or wet chemical etching, such as $KI/I_2$-etching to remove gold, etching using a strong base to remove aluminum.

In one embodiment, the method according to the present invention further comprises the step:
i') introducing an aperture into said anti-sticking layer by dry etching, such as dry argon-etching, or wet chemical etching, such as $KI/I_2$-etching, and using said first polymeric layer as an etching mask.

In one embodiment, the method according to the present invention further comprises the step:
h') selectively etching said polymeric membrane on said anti-sticking layer and said substrate by using dry plasma etching, such as $O_2$ plasma etching, or chemical wet etching, such as oxidation in $H_2SO_4/H_2O_2$, to reduce the total thickness of said polymeric membrane, and, optionally, removing said substrate by peeling off said polymeric membrane on and together with said anti-sticking layer from said substrate.

In one embodiment, the method according to the present invention further comprises the step:
k) selectively etching said polymeric membrane on said anti-sticking layer and, if present, on said substrate, by using dry plasma etching, such as $O_2$-plasma etching, or chemical wet etching, such as oxidation in $H_2SO_4/H_2O_2$ to reduce the total thickness of said polymeric membrane, and, optionally, removing said substrate, if present, by peeling off said polymeric membrane on and together with said anti-sticking layer from said substrate.

In one embodiment, after removal of said substrate, said polymeric membrane and/or, if present, said anti-sticking layer is/are further surface modified by a method selected from
a) immobilizing functional groups or molecules thereon to match the surface properties of a lipid bilayer to be introduced into said first aperture or into said aperture in said anti-sticking layer,
b) surface activation by introducing OH-groups through $O_2$-plasma treatment
c) enhancing the surface roughness by etching, such as Ar, $CHF_3$, $CF_4$, $O_2$-plasma and combinations thereof,
d) deposition of one or several functional layers, e.g. by dip coating, gas-phase deposition or evaporation, and any combination of steps a)-d).

Preferably, said functional layer is selected from fluorosilanes, alkylsilanes, fluorinated plasma components from $CHF_3$, $CF_4$.

The objects of the present invention are also solved by a polymeric membrane having a tapered pore and comprising (n+2) polymeric layers as defined above, wherein said tapered pore is formed by (n+2) apertures of differing diameter within said (n+2) polymeric layers, n being an integer from 0 to 10, said n+2 apertures being aligned with each other to form said tapered pore.

Preferably, said (n+2) apertures are concentrically aligned.

In one embodiment, said tapered pore, at its smallest diameter, has a ratio of diameter of said pore to height of said polymeric layer at said smallest diameter of said pore of $\geq 3$.

In one embodiment, the polymeric membrane is fabricated by the method according to the present invention.

In one embodiment, the polymeric membrane according to the present invention has a plurality of tapered pores, as defined above.

In one embodiment, the polymeric membrane according to the present invention further comprises a lipid bilayer spanning the pore at its smallest diameter and, optionally, having biological membrane proteins, such as pore proteins or channel proteins incorporated in said lipid bilayer.

The objects of the present invention are also solved by the use of a membrane according to the present invention for forming a lipid bilayer.

The objects of the present invention are also solved by the use of a polymeric membrane according to the present invention for physiological measurements, such as patch clamp measurements or as an electronic sensor.

The term "anti-sticking layer", as used herein, is meant to describe a layer which, because of its low adhesion to a substrate, allows the peeling off of said anti-sticking layer, together with any additional layer on top of it, from said substrate. It is clear from the foregoing that said anti-sticking layer should only weakly adhere to the flat surface of a substrate, but it should have better adhesion properties to a layer attached to the anti-sticking layer on the other side.

The exact choice of material of the anti-sticking layer therefore depends on the material of the substrate and can be determined by someone skilled in the art using his knowledge without undue experimentation. For example, someone skilled in the art knows that a layer of gold has very little adhesion to a silicon oxide surface. In general, the anti-sticking layer is made of a material selected from the group comprising metals, oxides, plastics or other organic components which show a weak adhesion to the material of which the substrate may be made. Useful examples of materials for the anti-sticking layer are gold, silver, platinum, titanium, mica, carbon, fluorosilanes, water-solube resists, and heat-disposable thin-film materials. The term "pore" as used herein is meant to refer to an opening in a membrane which is made of a plurality, i.e. at least 2, apertures on top of each other, wherein each aperture is formed in or by a layer within the membrane. A membrane in accordance with the present invention has at least 2 layers. In one embodiment, the membrane has (n+2) layers, wherein n is an integer selected from 0 to 10, i.e. 0, 1, 2, 3, 4, 5, 6, 7, 8, 9, 10.

The term "aspect ratio", as used herein, is defined as the ratio between the diameter (d) of the aperture and the height/thickness (h) of the layer/membrane at that particular diameter (d:h). Preferably, in a tapered pore according to the present invention, the term "aspect ratio" is meant to refer to the ratio of diameter to height at the smallest diameter, i.e. diameter of the smallest aperture to height of the layer forming this aperture. The height at the smallest diameter is the height of the layer forming the aperture with the smallest diameter.

In the following we present a solution for realising mechanically stable membranes with apertures of a diameter of the magnitude of 10 μm or even below and large aspect ratios. As described above, we suggest that the aspect ratio (ratio between the diameter of the aperture/pore (d) and the thickness (h) of the membrane that holds the aperture) is important for the bilayer formation dynamics. Aspect ratios of 3:1 and higher are preferable, while d should be equal or smaller than 10 μm and h smaller than 2 μm.

The basic principle of the design is shown in FIG. 1.

The optimisation of the aspect ratio requires stable sub-10 μm thick membranes that contain a single aperture or an array of apertures, each of them having a diameter of preferably 10 μm or smaller. Furthermore, the fabrication process should be as cheap as possible and therefore rely on polymeric materials or hybrid structures of polymeric materials and inorganic materials such as oxides (silicon oxides, silicon nitrides, aluminium oxides).

The fabrication approach in order to realise free-standing and stable sub-10 μm thick polymeric membranes on waferscale and at low costs is described in the following:

A thin membrane layer 1 is deposited by a deposition method on a sacrificial solid support and a single aperture is introduced by applying a patterning method. The diameter of the aperture is in the range 1 nm to 100 μm, preferably smaller than 10 μm. On top of this first layer, a second membrane layer 2 ("supporting layer") is introduced by a deposition method and a second aperture is introduced by a patterning method. The diameter of the second aperture is preferably larger than the diameter of the first aperture. The thickness of layer 1 is in the range 0.3 nm to 20 μm, preferably in the range 0.3 nm to 2 μm. The thickness of supporting layer 2 is in the range between 500 nm and 1 mm, preferably in the range 5 μm to 50 μm.

The aperture of the layer 1 and that of layer 2 shall be aligned in a way that the smaller aperture is partly or completely open (FIG. 1). As used herein, such a structure is herein also referred to as a tapered pore. This two-layer structure can be extended by one ore more additional layers, each of them containing an aperture (FIG. 2). A schematic view of the approach is shown in FIG. 3 and will be explained in detail in the example section.

It is also possible to include more than one aperture or pore into layer 1 and the following layers, in order to build up pore arrays. The number of array elements could vary between 2 and more than 100.

The patterning method can be selected from a number of different approaches, such as optical lithography, electron beam lithography, imprint lithography, and focused ion beam etching.

The deposition method can be selected from a number of different approaches: spin-coating, vacuum deposition, spray coating, dip-coating.

The materials that are potentially useful for layer 1 and layer 2 (and the following layers) are polymers that can be deposited and patterned by the mentioned deposition and patterning methods, respectively. Preferred polymers, useful in accordance with the present invention, are positive and negative tone resists. Example polymers are negative-tone SU8® resists, positive and negative-tone AZ®-resists, PMMA electron beam resists, UV6 mix & match® resists.

Extension of Aperture Through Back-Layer

In a variation of the present inventors' approach, the underlying "layer 0" in FIG. 3 (e.g., gold) can be used as an anchor layer for the immobilisation of specific molecules, which perform a certain functionality, e.g. to match the surface properties to the properties of the bi-layer. As shown in FIG. 4, the "layer 0" could be selectively etched by using dry plasma or wet-etching and by using the polymer "layer 1" as etching mask.

Post-fabrication Engineering of the Membranes

For further improvement of the aspect ratio, the present inventors also suggest to etch the polymeric membrane by using dry plasma or wet-etching in order to reduce membrane thickness, while keeping the aperture diameter almost constant (FIG. 5). This in turn enhances the aspect ratio. The present inventors also expect that the edges of the aperture may lose their initial rectangular cross-section shape and may adapt a more triangular cross-section, which leads to a conic shape of the aperture.

In the case of extended pores as described above, dry etching or wet-etching could be used to not only thin the "layer 1" in a controlled fashion, but also to partially remove "layer 1" from the edge of the underlying "layer 0" (FIG. 6). The resulting edge structure consists of "layer 2" as the major supporting layer, "layer 1" as another supporting layer and the edge ring of "layer 0", which could be very thin on the one hand (larger aspect ratios) and subject to tailored surface modification on the other hand.

Surface Modification:

The present inventors also suggest a number of surface modifications of the membranes—mainly in order to enhance the hydrophobicity of the membrane surface. The purpose of the hydrophobic surface is to improve the wetting of an organic phase (so-called "pre-treatment") that forms the annulus (gasket) that supports the bilayer. The inventors expect that the enhanced membrane wetability with the organic phase enhances the formation and the stability of bilayers across the aperture.

The modification may include a surface activation, cleaning, roughness-enhancement step (e.g., by Ar, $CHF_3$, $CF_4$, $O_2$ plasma and combinations), which may be followed by the deposition of functional layers through dip-coating, gas-phase deposition, or evaporation methods. Preferred functional layers consist of one of the following materials: fluorosilanes, alkysilanes, fluorinated components from the respective plasma used.

BRIEF DESCRIPTION OF THE SEVERAL VIEWS OF THE DRAWINGS

Moreover, reference is made to the figures, wherein

FIGS. 11a and 11b show the results of SEM morphology measurements and water contact angle and AFM roughness analysis.

FIGS. 12a and 12b show SEM morphology measurements and water contact angle and AFM roughness analysis.

Moreover, reference is made to the following examples, which are given to illustrate, not to limit the present invention.

DETAILED DESCRIPTION OF THE INVENTION

EXAMPLE 1

Tapered Pore Fabrication

Figure 1:
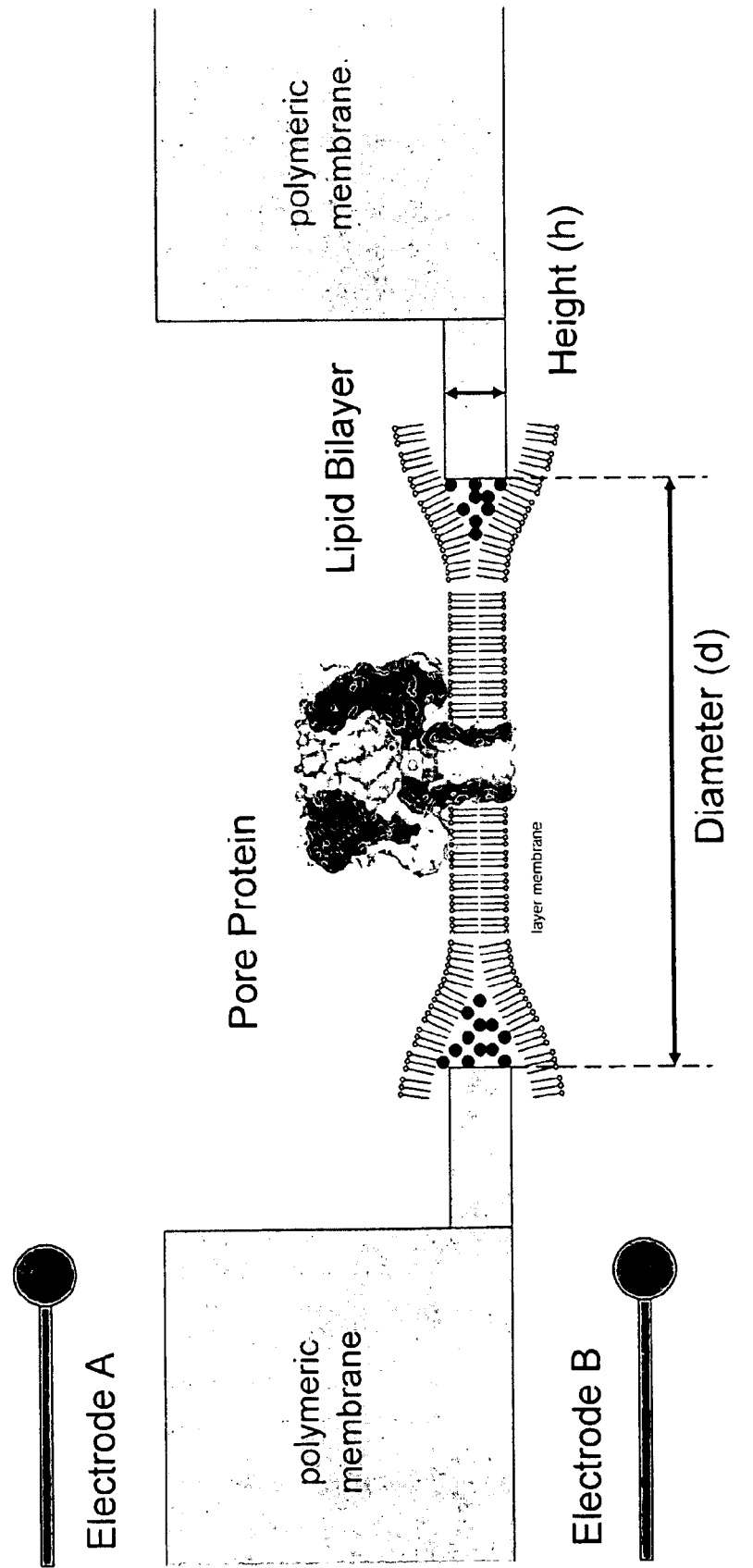
FIG. 1 shows the basic principle of the design of a polymeric membrane having a tapered pore and having a lipid bilayer and a pore protein inserted therein, in accordance with the present invention.
Figure 2:
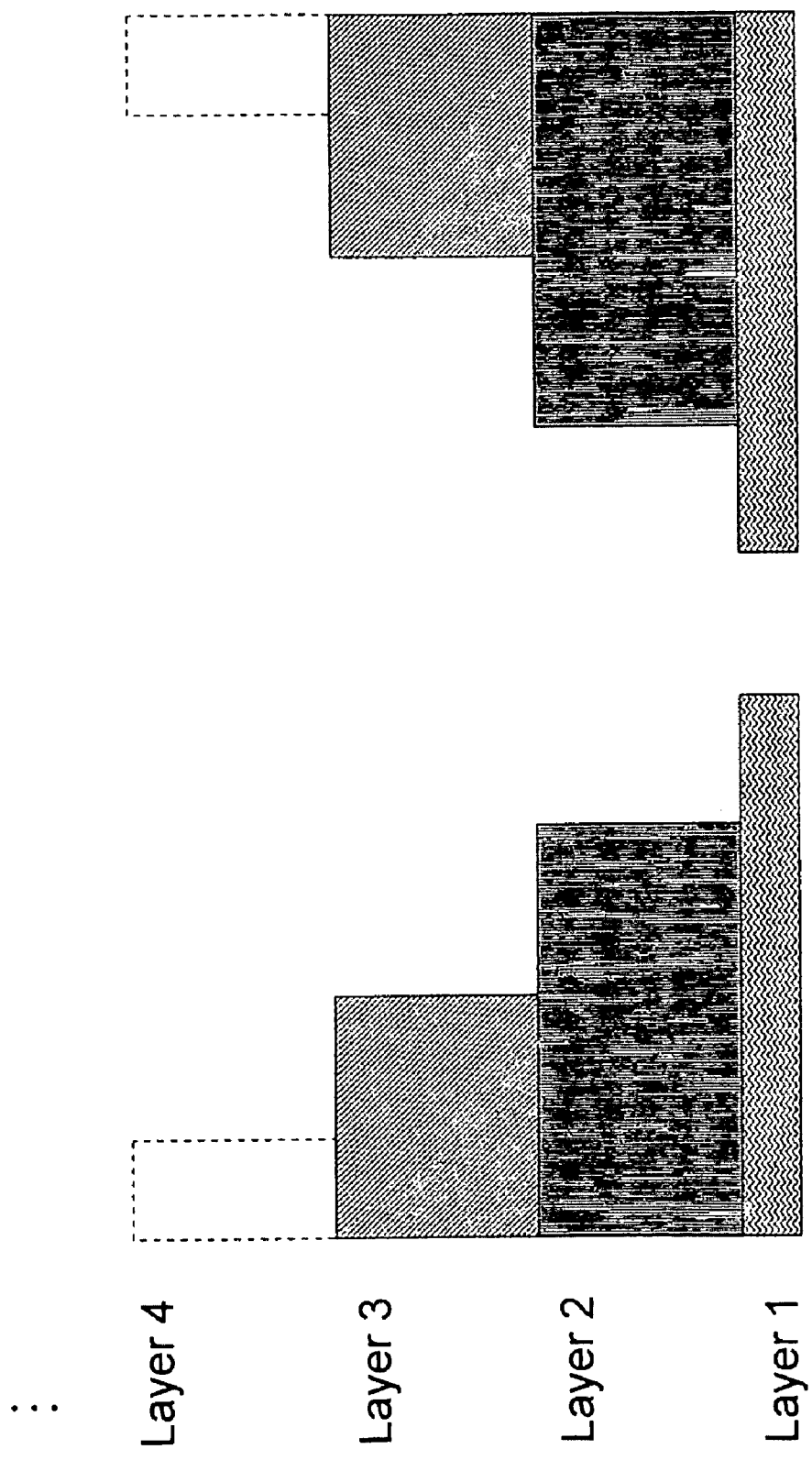
FIG. 2 shows a schematic view of the tapered pore formed by the two-layered/multilayered structure of the membrane.
Figure 3:
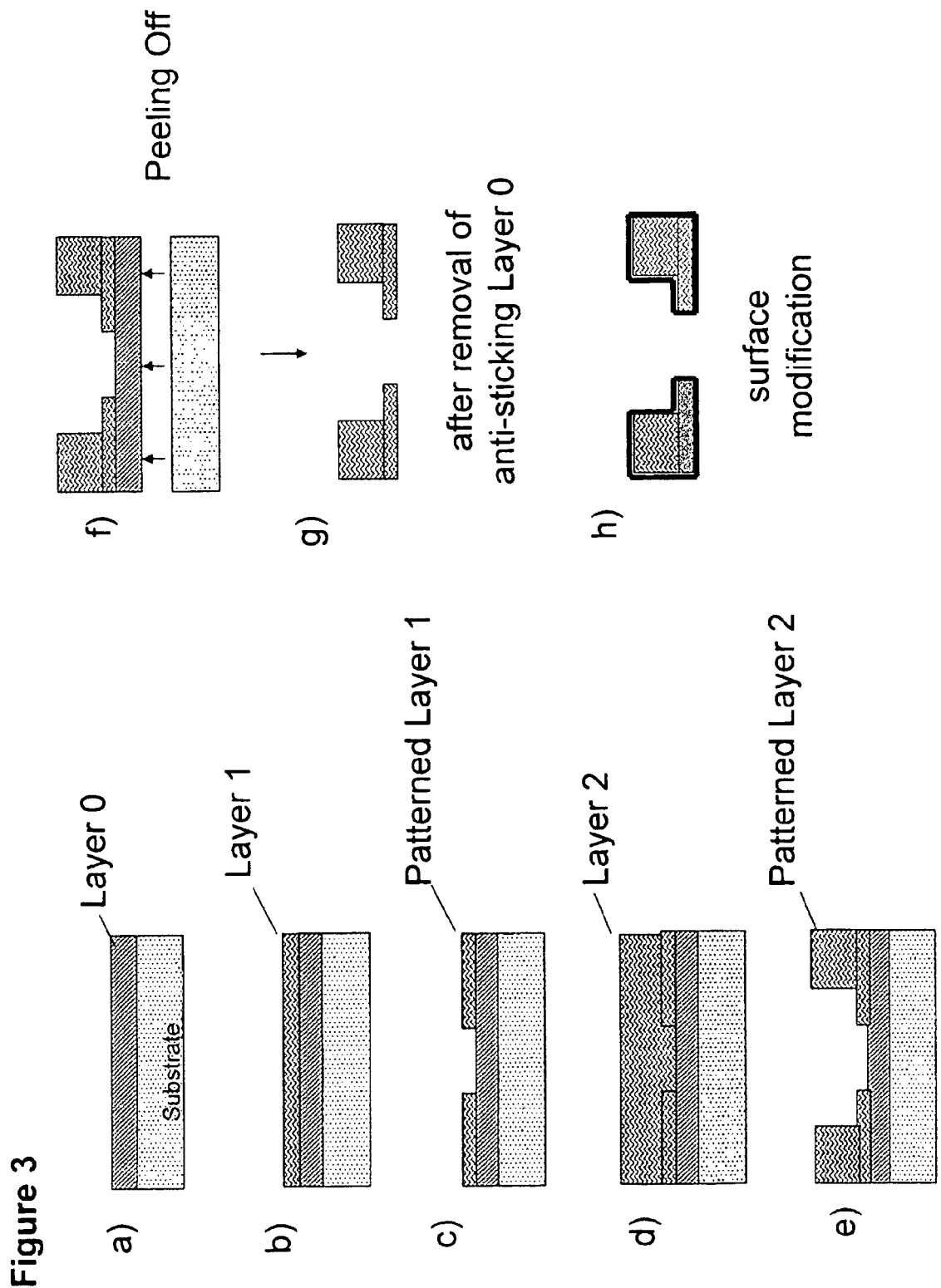
FIG. 3 shows the manufacturing of such tapered pore.
Figure 4:
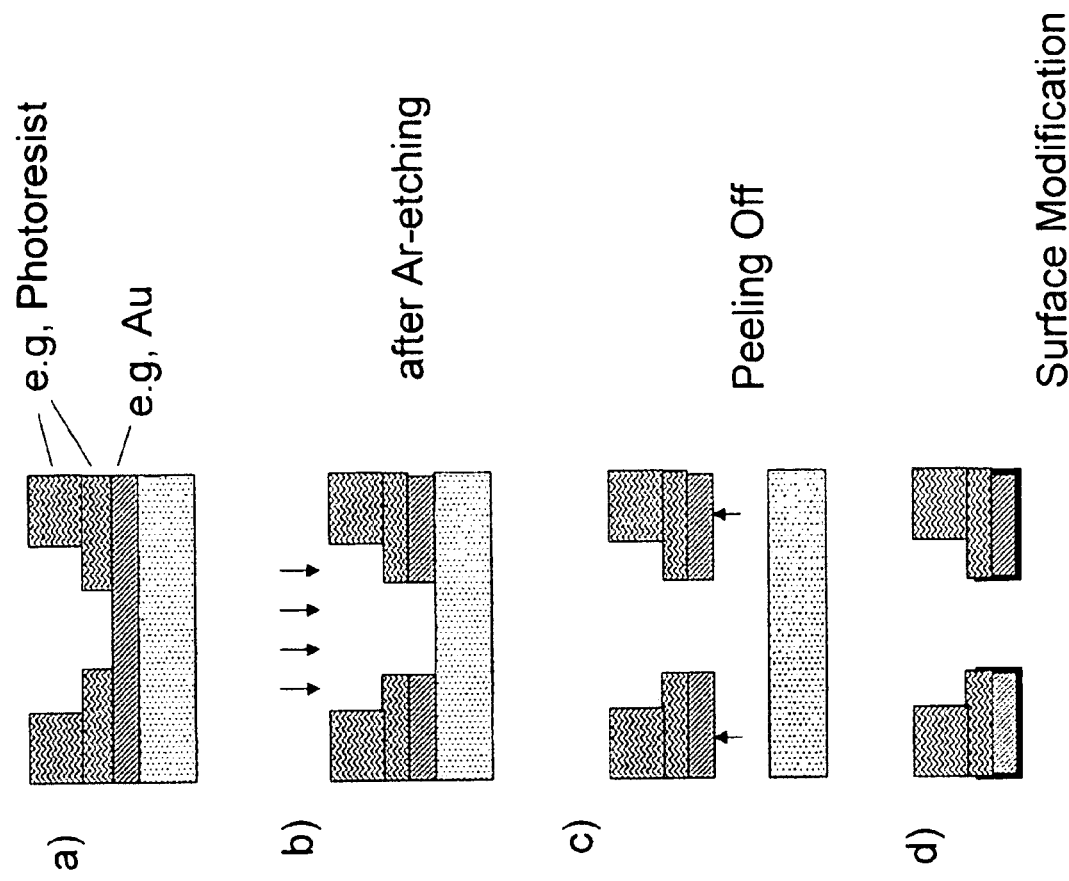
FIG. 4 shows a variation of the process shown in FIG. 3.
Figure 5:
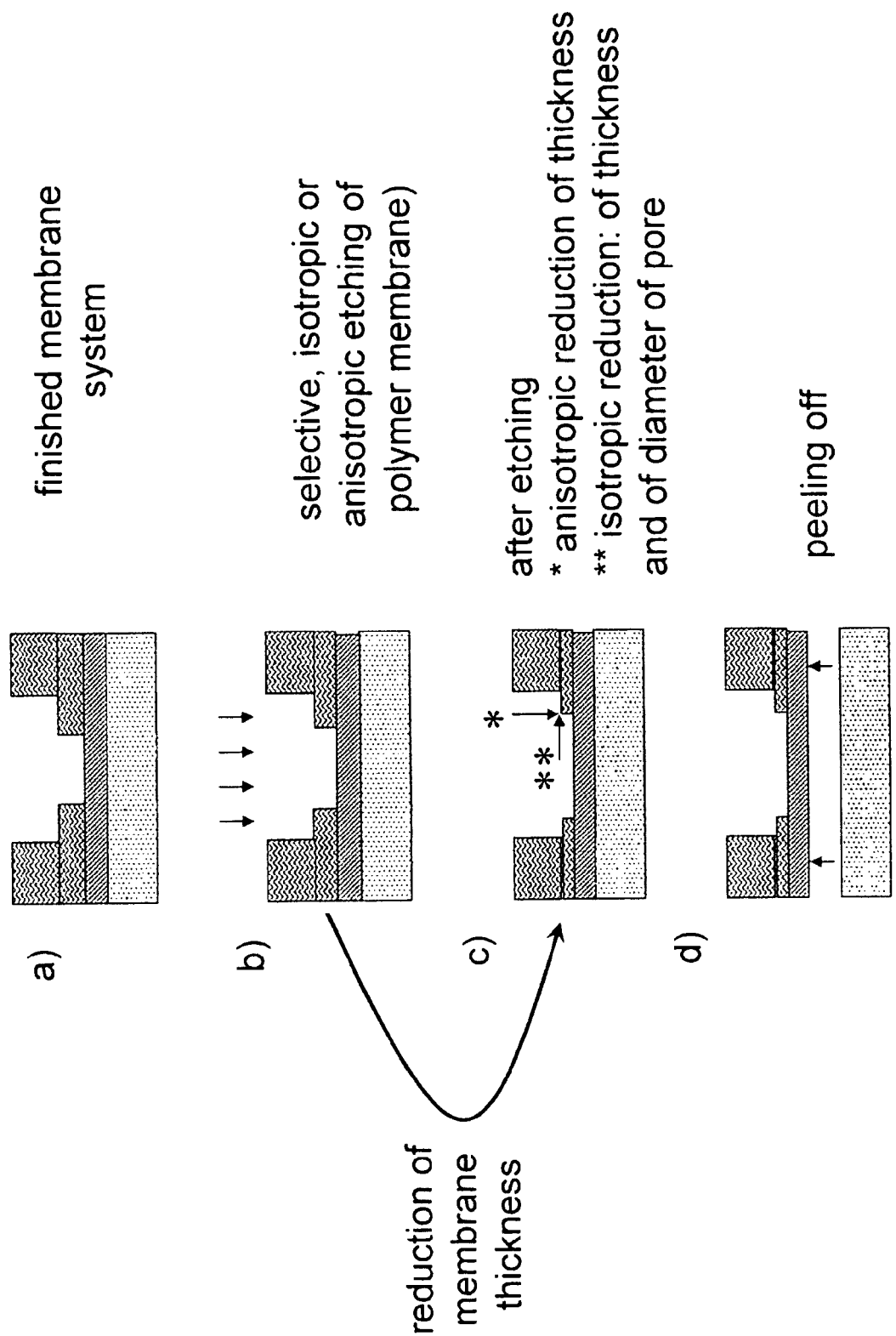
FIG. 5 shows yet another variation of the manufacturing process.

The steps of a fabrication approach that realises a 10 µm wide aperture in a 500 nm thick polymeric membrane are shown in FIG. 3. A silicon wafer with native silicon oxide on top (Cyrstec GmbH, Berlin, Germany) is covered with a 40 nm thick, thermally evaporated anti-sticking layer, e.g. a 40 nm thick, thermally evaporated layer of gold (FIG. 3,*a*) (=layer 0). Then, the first membrane layer is spin-coated onto the gold (FIG. 3,*b*) (=layer 1). In this example, the present inventors used negative-tone SU8 photoresist (Micro Resist Technology GmbH, Berlin, Germany) of the so-called 2000.5 formulation (Cat.-No.:SU8 2000.5, Micro Resist Technology GmbH, Berlin, Germany), which gives a 500 nm thick layer is spin-coated at 3000 rpm for. After soft-baking at 65° C. for 1 min and 95° C. for 2 minutes, the resist layer was exposed at 365 nm to 400 nm wavelength using a MJB3 contact aligner (Karl Suss GmbH, Germany) using a dose of about 250 mJ/cm2. The applied mask was specifically designed in order to pattern a circular, rectangular, or squared membrane with an area in the range of several $mm^2$ and an aperture/pore in its centre. The post-exposure bake step consists of a bake at 65° C. for 1 minute and at 95° C. for 2 minutes.

After developing the layer for 2 minutes using SU8-developer (Micro Resist Technology GmbH, Berlin, Germany) (FIG. 3,*c*), a second SU8 resist layer ("supporting layer") (=layer 2) was spun onto the first layer (FIG. 3,*d*). In this case the SU8 2007 formulation was selected, which results in a about 13 µm thick layer, if spun at 1000 rpm. After a soft-bake at 65° C. for 2 minutes and at 95° C. for 3 minutes, the supporting layer was exposed using the same aligner and a UV light dose of about 350 $mJ/cm^2$. During this step, the wider aperture in the supporting layer was carefully aligned onto the smaller aperture in the layer 1 by using alignment marks. After the post-exposure bake at 65° C. for 1 minute and at 95° C. for 2 minutes, the structure was developed for 2.5 minutes. (FIG. 3,*e*)

Peeling step: after these steps, the membrane could be lifted by grapping it with a sharp tweezer or any other suitable tool. The membrane easily releases from the substrate due to the week adhesion between the gold-layer and the siliconoxide substrate. (FIG. 3,*f*)

Figure 7A:
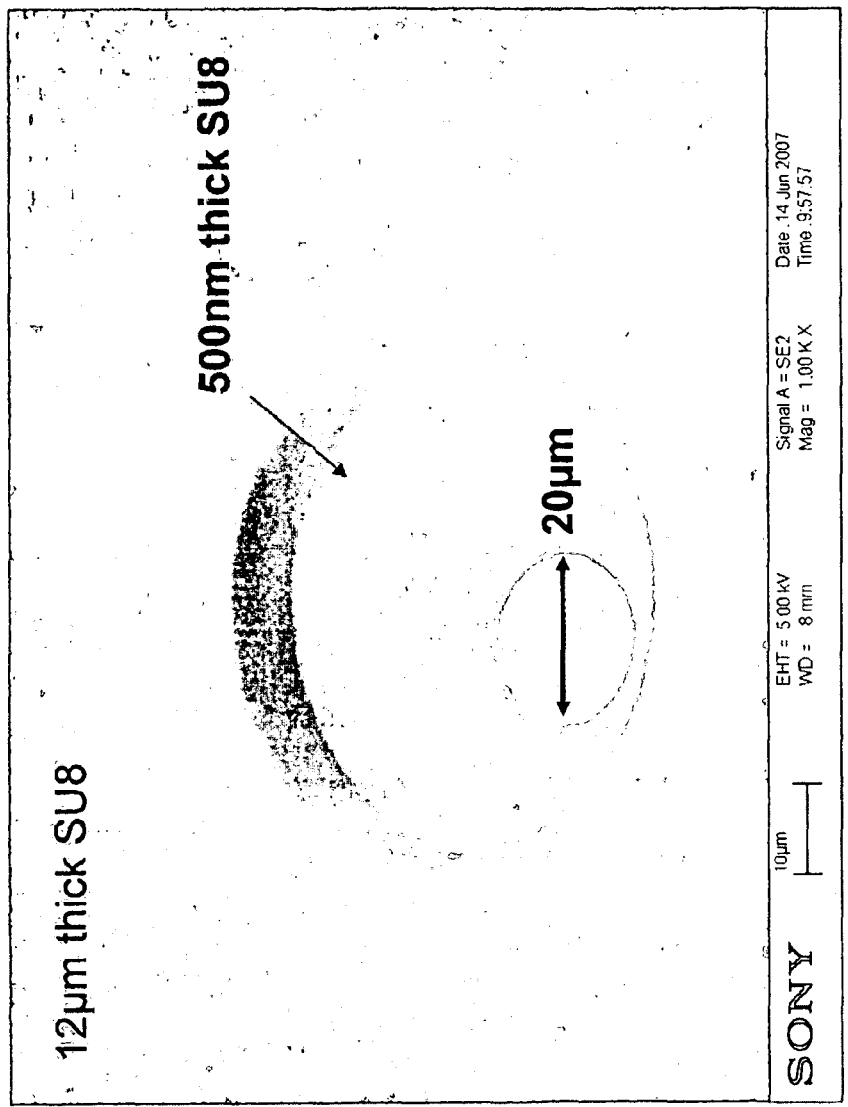
FIG. 7a shows an SEM image of a resulting membrane/aperture structure. The central aperture diameter is 20 µm. The height of the SU8 layer is 500 nm.
Figure 7B:
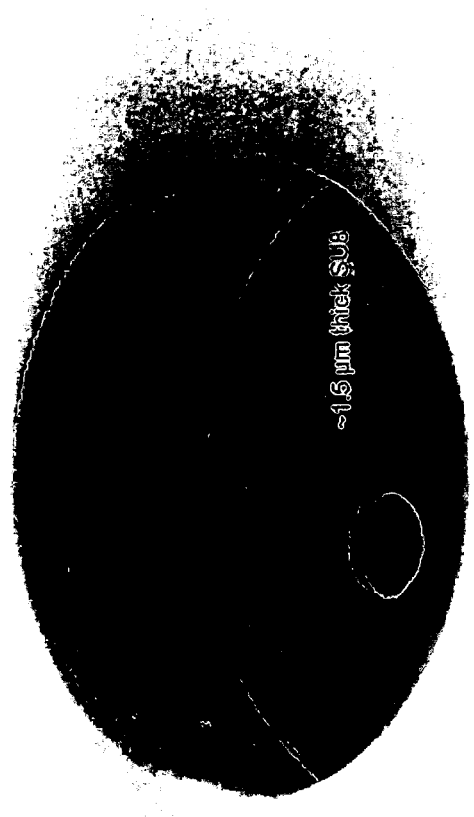
FIG. 7b shows an SEM image of a central 4.5 µm wide aperture in a 1.5 µm thick SU8 layer.

Gold-removal step: The gold layer is then removed either by dry argon-etching or by wet-chemical etching, e.g., $KI/I_2$ etching. FIGS. 7a and 7b show an SEM image of the resulting membrane/aperture structure.

EXAMPLE 2

Tapered Pore with Gold Backside-Layer

This example describes the realisation of a tapered pore, which is extended through a gold-backside layer that is used as an anchor layer for functional molecules.

The process is performed as described in Example 1. The peeling step is not performed at this stage, but instead of this, an Ar-plasma etching step or any other suitable etching step is inserted, during which the gold is completely removed from the aperture region. (FIG. 4*a-d*).

Figure 8:
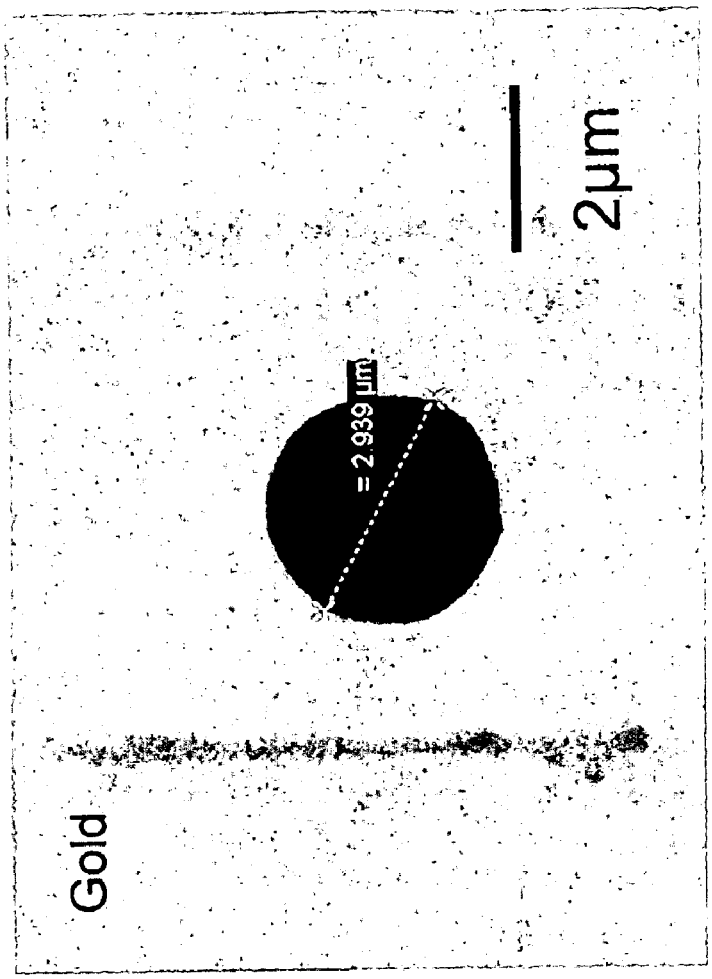
FIG. 8 shows an SEM image of the back of an example membrane in accordance with the present invention.

After this, the membrane layer can be lifted by peeling as described in Example 1. FIG. 8 shows SEM images of the back of an example membrane.

EXAMPLE 3

Figure 9:
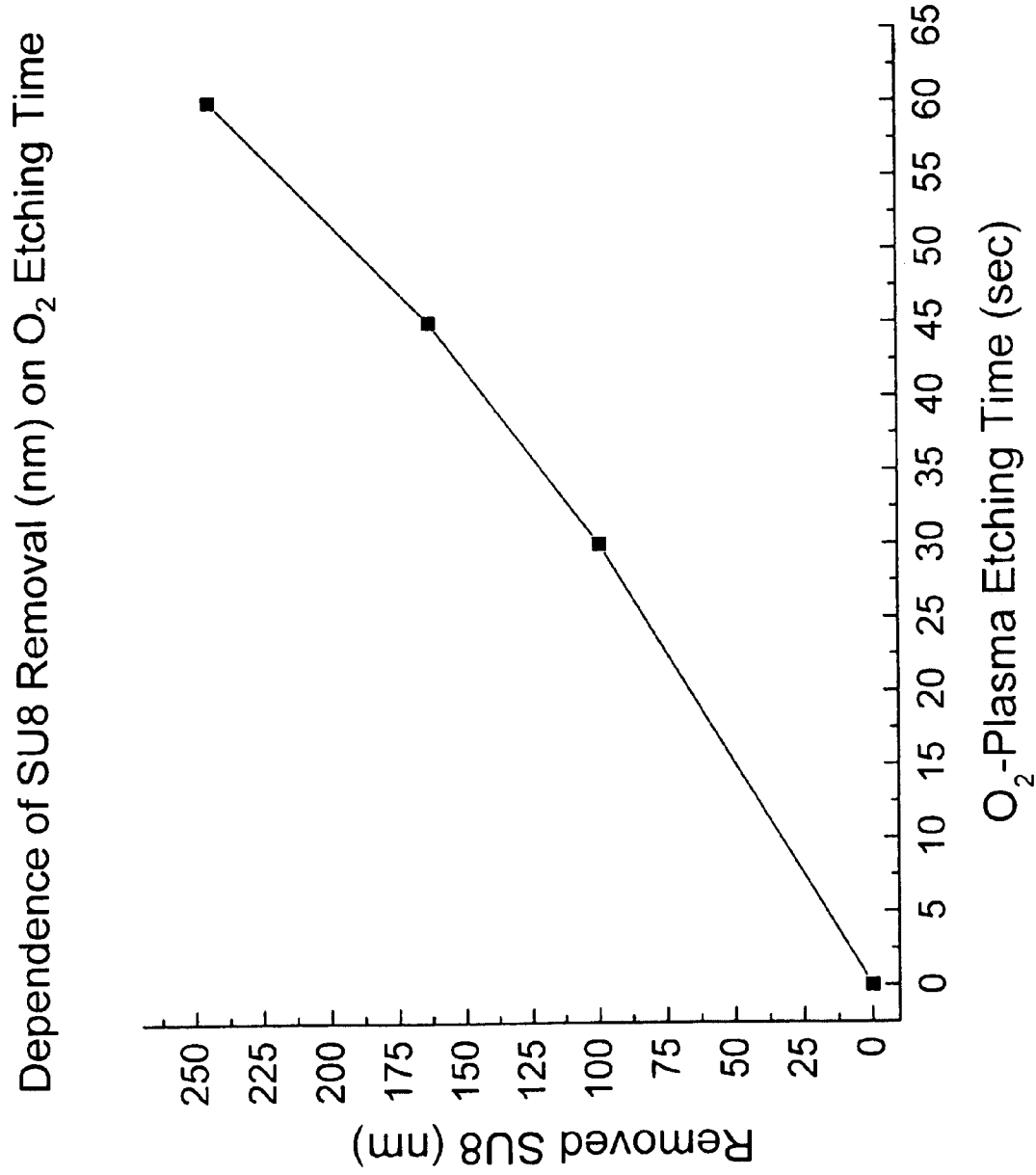
FIG. 9 shows the relationship between oxygen plasma etching time and the resulting thickness of a membrane.
Figure 10A:
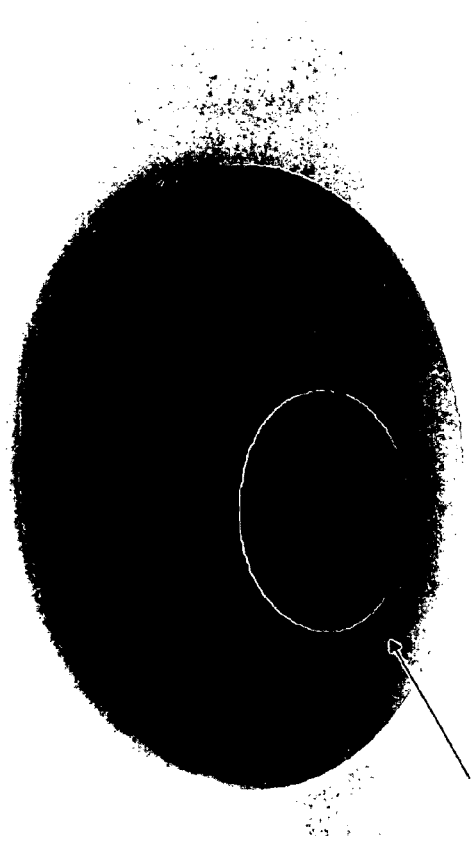
FIGS. 10a and 10b show the SEM images of an oxygen plasma etched SU8 membrane.
Figure 10B:
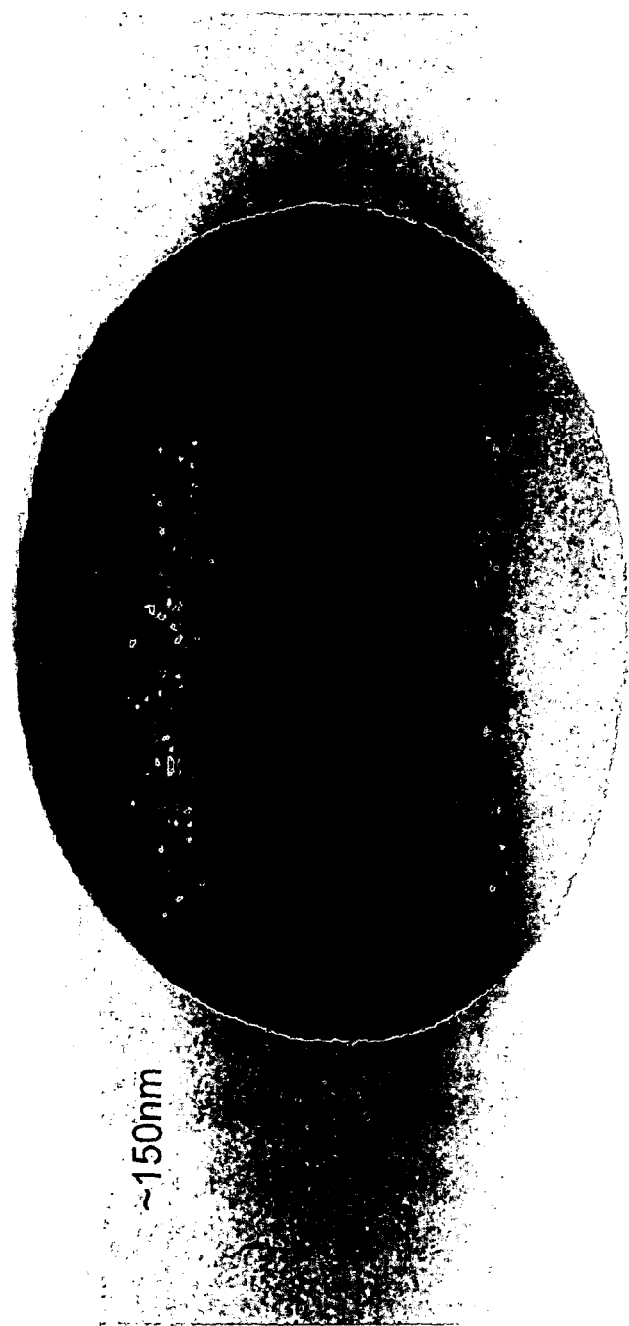

Post-fabrication Engineering: Tapered Pores with Thinned Membrane for very Large Aspect Ratios As described above, the aspect ratio of the fabricated apertures in the polymeric membranes could be improved by reducing the membrane thickness by dry or wet etching. Here the inventors present an example of using oxygen plasma etching. An SU8 membrane system was fabricated as described in Example 1. Then, as shown in FIG. 5*a-d*, the wafer was introduced into a reactive ion etching machine (PlasmaLab 80, Oxford Instruments, Germany) and oxygen plasma was applied at 200W for different etching times. FIG. 9 shows the relationship between the $O_2$ plasma etching time and the resulting thickness of an initially 500 nm thick SU8 membrane. FIGS. 10*a* and 10*b* show the SEM images of an $O_2$ plasma etched SU8 membrane. The thickness of the central membrane is about 150 nm, the aperture diameter is 20 µm, resulting in an aspect ratio of about 130:1.

Figure 6:
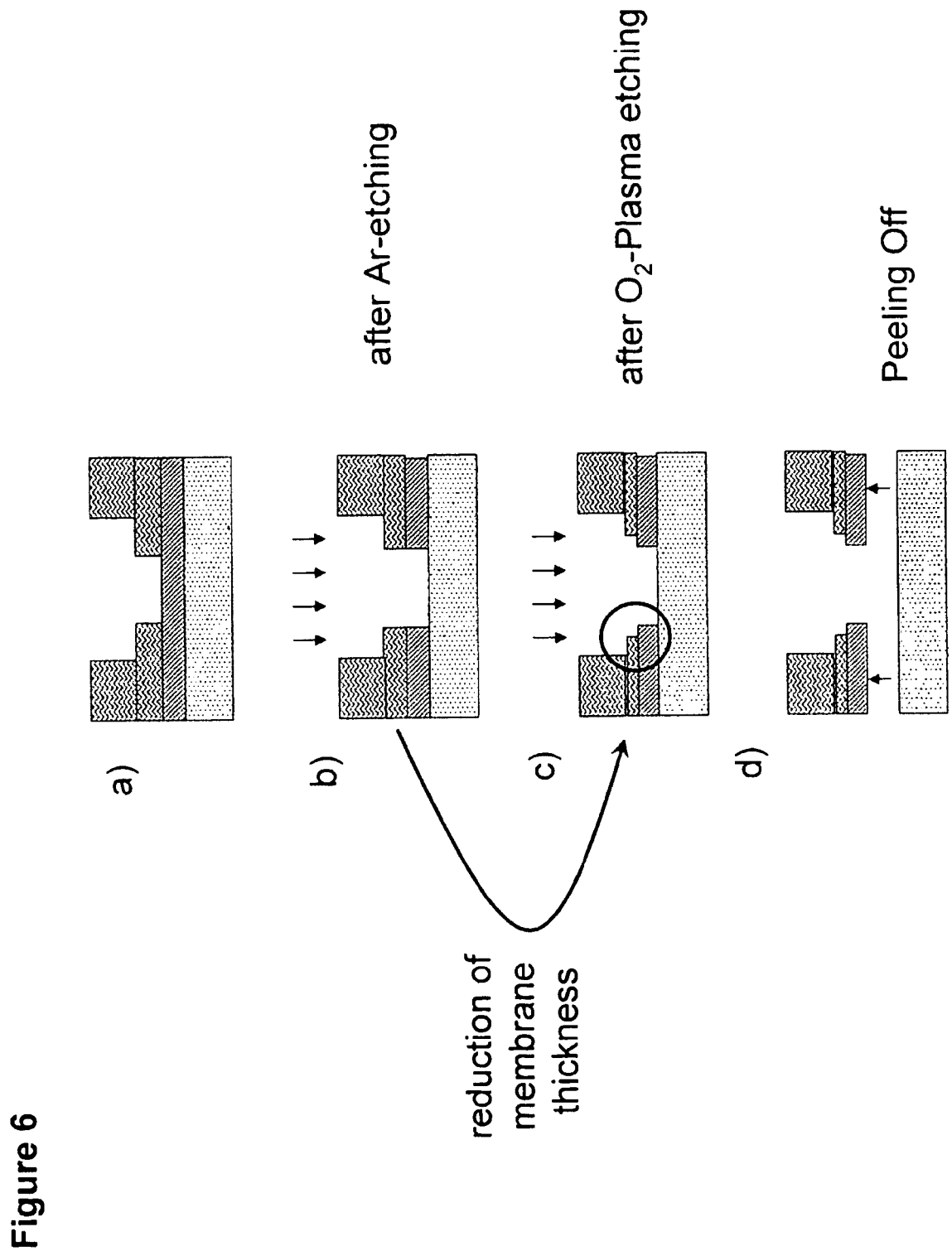
FIG. 6 shows yet a further variation of the manufacturing process.

In a further variation, the aperture is first etched through the gold-back layer (see Example 2) and then an oxygen-plasma is used to thin the "layer 1" (FIG. 3*b,c*) and—at the same time to slightly increase the diameter of the aperture in "layer 1" as shown in FIG. 6*c*.

EXAMPLE 4

Surface Modified Membranes

EXAMPLE 4.1

Silanisation in Liquid Phase

Prior to the silanisation in toluene, the membrane surface was cleaned and covered with OH-groups by applying a short oxygen plasma treatment (PlasmaLab 80, Oxford Instruments, Germany). 1-10 seconds plasma time at 100-200 W plasma power and 50-100 mbar background pressure are usually sufficient to activate the SU8 surface. The silane component was diluted in water-free toluene to achieve a volume concentration of about 1-3%. The activated SU8 surface was immersed into the silane solution for 10-60 minutes, washed with fresh toluene and dried.

EXAMPLE 4.2

Silane Vapour Deposition

For vapour deposition of silane, 100-500 µl of the pure silane solution was either heated in a oil bath to temperatures between 100° C. and 160° C. (depending on the type of silane, mainly in case of ethoxy-silanes) or just brought into a vacuum chamber (e.g. in case of chloro-silanes). The background pressure was adjusted to about 0.5 mbar after insertion of the silane. The activated SU8 surface was brought either into the vapour of the heated silane or into the vacuum chamber and remained there for 20-60 minutes. Usually, contact angle and XPS measurements indicated that silanes were successfully bound to the SU8 surface.

Example 4.3

Surface Modification by Plasma Treatment

A reactive ion etching machine (PlasmaLab 80, Oxford Instruments, Germany) was used to modify the surface of for example SU8 membranes. Ar, $O_2$, $CHF_3$, $CF_4$ plasmas and mixtures hereof have two effects on the membrane surface. Firstly, they damage the surface by partial removal of material. This effect usually increases the surface roughness of the treated surface. Secondly, $CHF_3$ and $CF_4$ plasmas are known to partially cover the treated surfaces with fluorinated components. By using the reactive ion etching plasma approach, the present inventors could combine both effects and found that the treated surfaces show very high contact angles of more than 100°.

CHF3/Ar Plasma Treatment

Figure 11B:
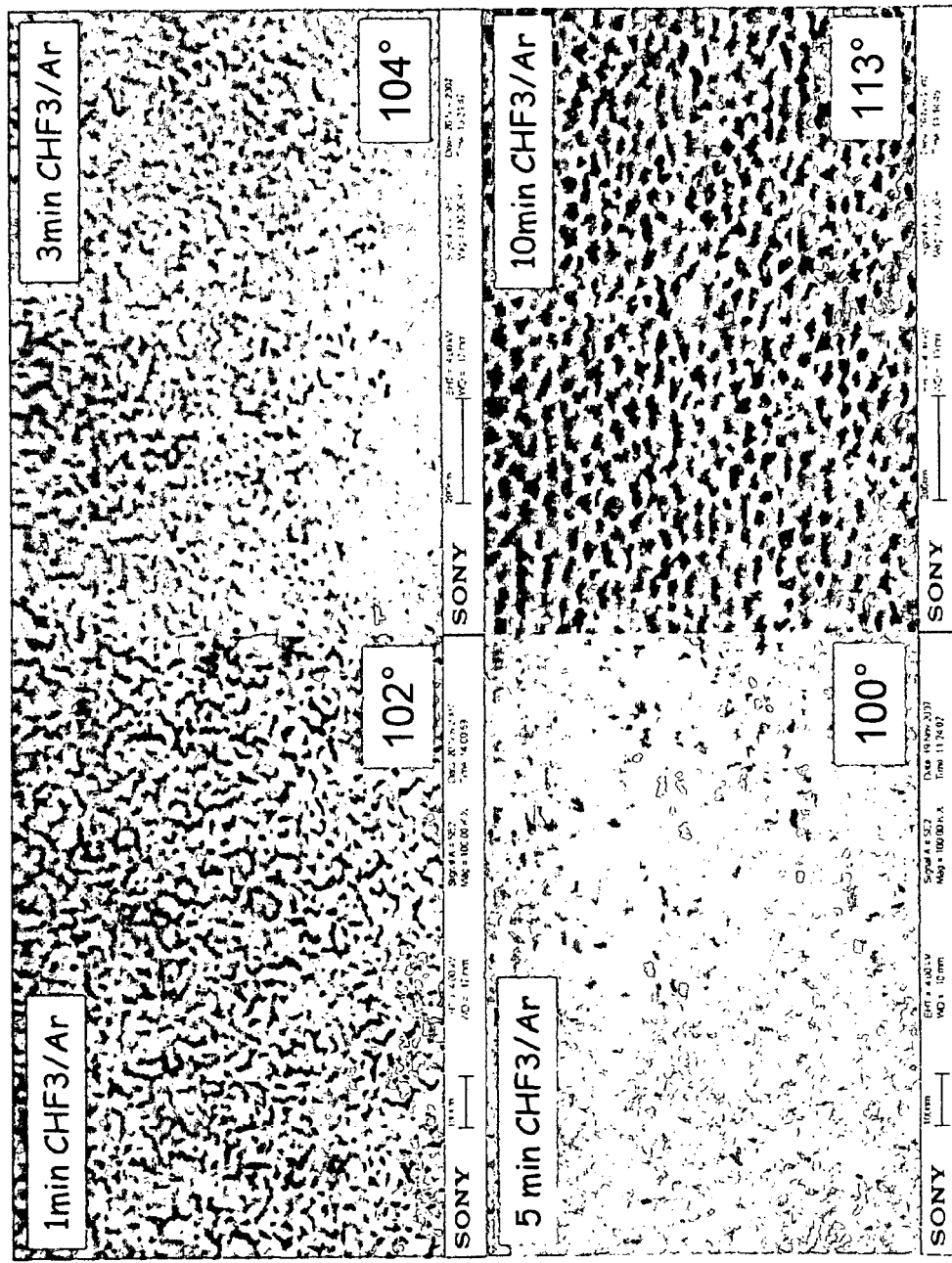

SU8 membranes such as fabricated in Example 1 were inserted into the PlasmaLab 80 machine and treated for 1 to 10 minutes at a CHF3 flow of 25 sccm and an Ar flow of 25 sccm. The background pressure was 30 mT and the plasma generator power was 200 W. The results of SEM morphology measurements, as well as water contact angle and AFM roughness analysis are shown in FIGS. 11*a* and 11*b*, respectively.

CHF3/CF4 Plasma Treatment

Figure 12B:
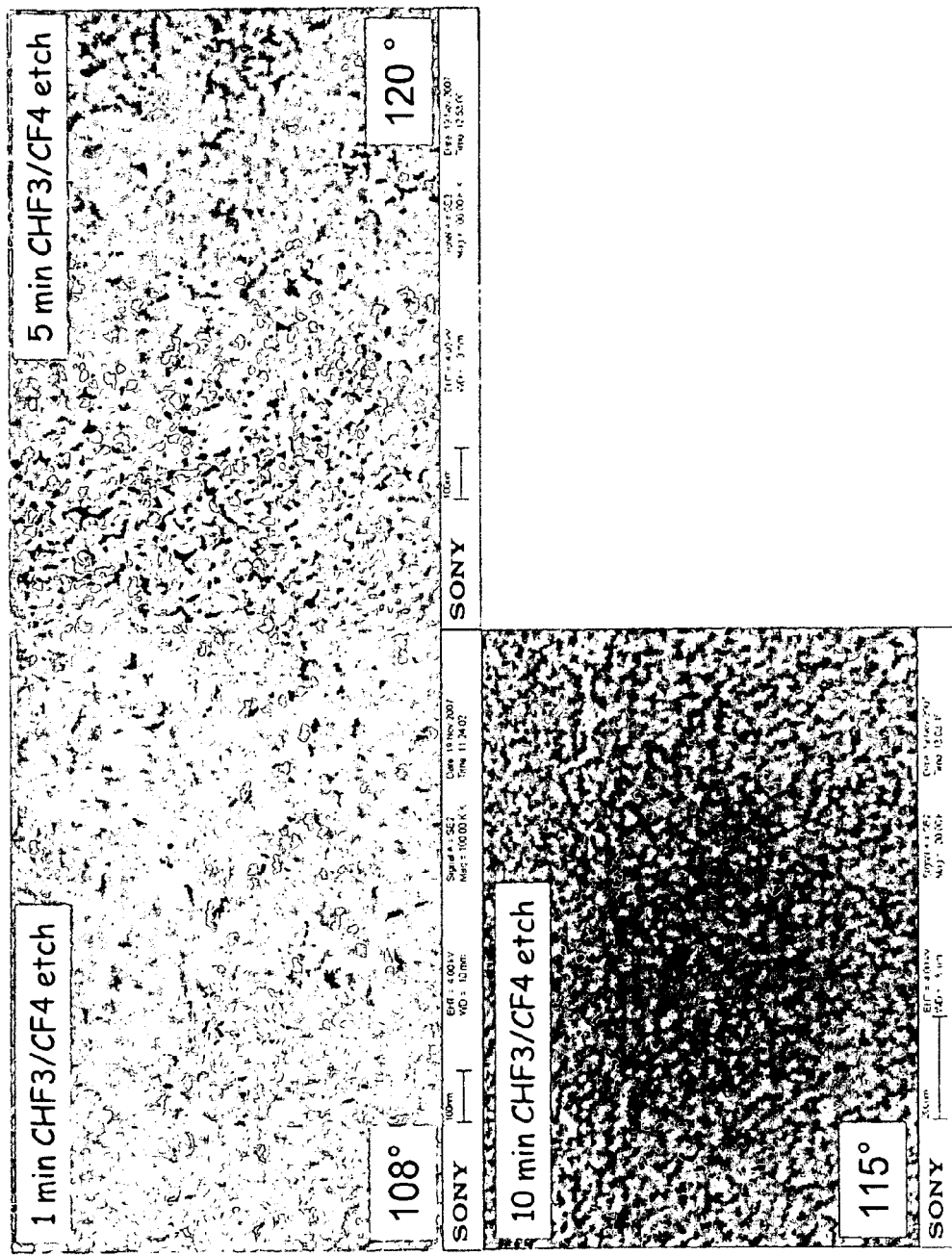

SU8 membranes such as fabricated in Example 1 were inserted into the PlasmaLab 80 machine and treated for 1 to 10 minutes at a CHF3 flow of 20 sccm and an CF4 flow of 20 sccm. The background pressure was 25 mT and the plasma generator power was 300 W. The results of SEM morphology measurements, as well as water contact angle and AFM roughness analysis are shown in FIGS. 12*a* and 12*b*, respectively.

For both types of plasmas, a strong increase of the contact angle can be seen already after a few minutes of treatment. At the same time, the roughness of the surfaces increases with plasma treatment time. The roughness of the CHF3/CF4 plasma treated surface is slightly smaller in comparison to the CHF3/Ar plasma treated surface.

EXAMPLE 5

Arrays of Tapered Pores

Figure 13:
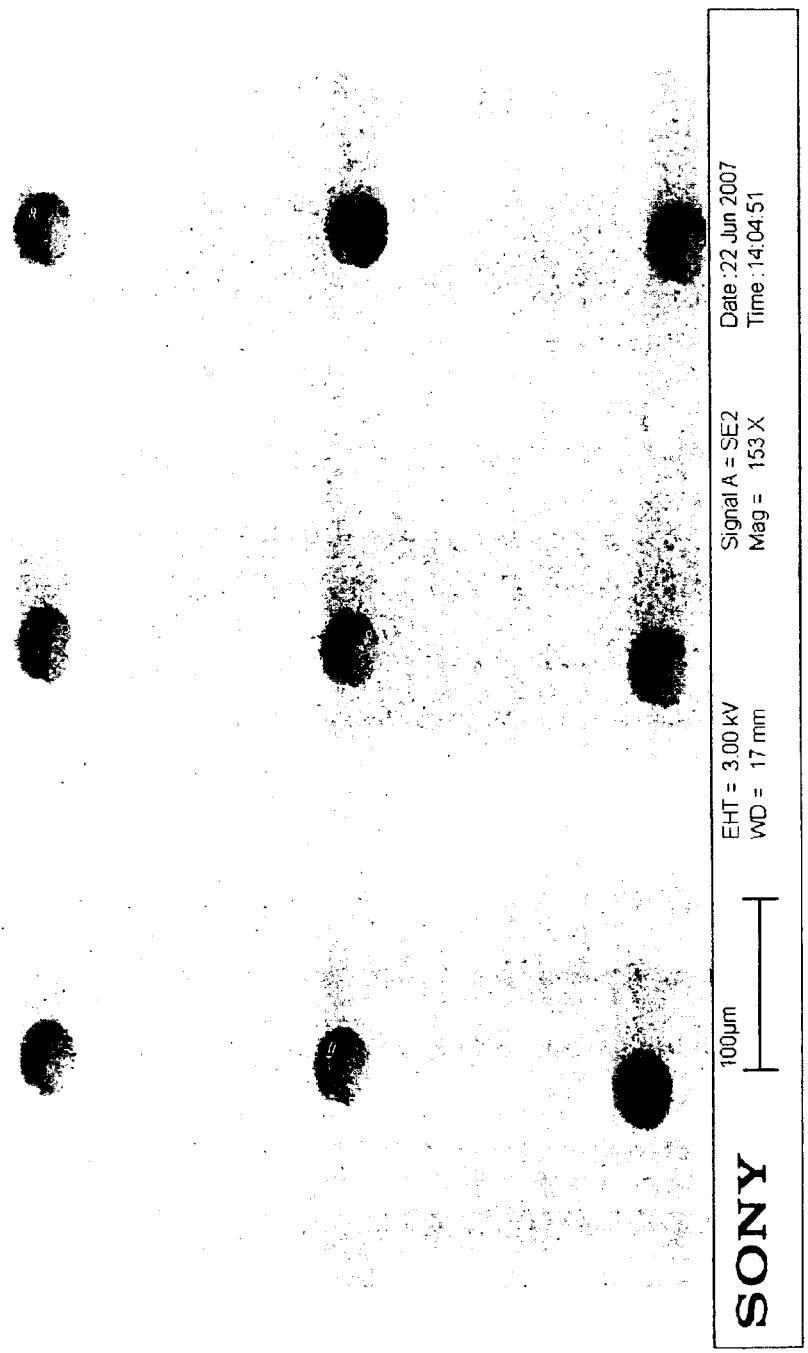
FIG. 13 shows an example of a 3×3 array of tapered pores in SU8 resist.

In order to satisfy the requirement of quick protein insertion also for the case of very small-area bilayers, the invented aperture structures can be arrayed to provide an effectively larger bilayer surface, while keeping the area of each individual bilayer advantageously small. FIG. 13 shows an example of a 3×3 array of tapered aperture in SU8 resist.

EXAMPLE 6

Bilayer Formation & Statistics in Comparison to Classical Apertures

Figure 14:
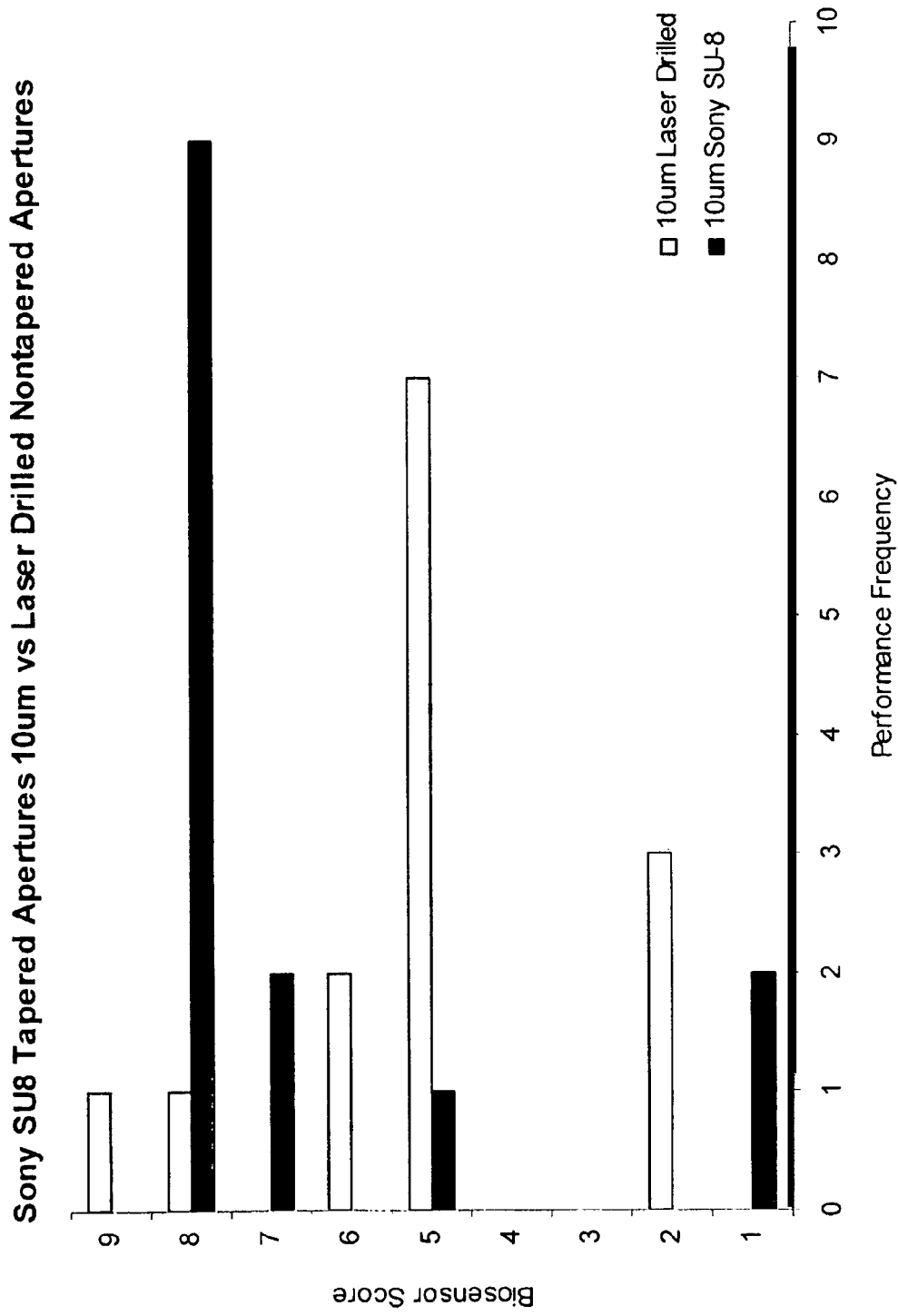
FIG. 14 shows a biosensor performance chart using membranes in accordance with the present invention in comparison with laser-drilled membranes.

FIG. 14 shows a biosensor performance chart for SU-8, 10 µm tapered apertures versus 10 µm laser drilled membranes using standard pretreatment conditions. The term "zappable" as used herein in connection with a bilayer means that the bilayer can be destroyed by a short voltage pulse of several hundred of mV. The pore protein that was inserted in these experiments was alpha-hemolysine. Results shows that 10

μm tapered membranes perform better at forming bilayers with large areas for easy pore protein insertion (Biosensor score 8). The evidence shown here is strong.

Figure 15:
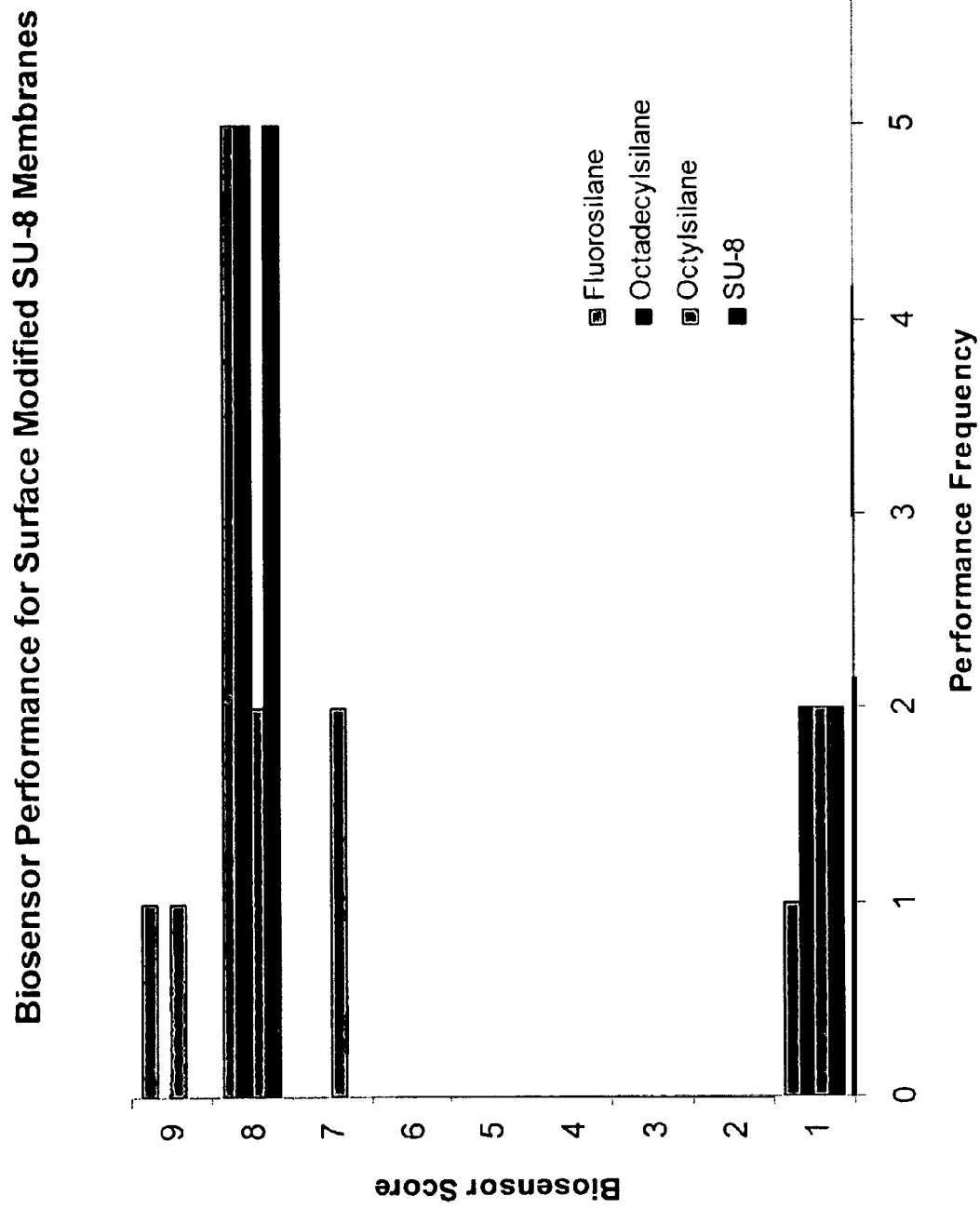
FIG. 15 shows the biosensor performance score chart for surface modified SU8 membranes in accordance with the present invention.

The "Biosensor Scoring" scheme is explained in the following:
- 10—Controlled number of pore proteins inserted
- 9—Bilayer formed first time, pore proteins inserted first time
- 8—Bilayer formed, pore proteins inserting
- 7—Initially blocked, but bilayer eventually formed with pore proteins inserting
- 6—Bilayer formed, pores insert, but bilayer lifetime is short
- 5—Zappable bilayer formed but no pore proteins insert
- 4—Initially blocked, but eventually zappable bilayer formed (no pore proteins)
- 3—Bilayer forms relatively easily (zappable), but has short lifetime
- 2—Unzappable blockage which can't be removed
- 1—Unbreakable connection after solution applied
- 0—Not scored FIG. 15 shows the biosensor performance score chart for surface modified Sony SU-8 membranes, i.e. examples membranes formed in accordance with the present invention. These results suggest that the chances of first pass bilayers with pores (Biosensor score 9) are improved by fluorosilane.

The membranes in accordance with the present invention are cheaper in comparison to silicon-based membranes, they provide very high aspect ratios at low aperture diameters around 10μm. Moreover, the membranes in accordance with the present invention are very thin and yet stable and can therefore be handled easily with a reduced risk of rapture.

References
[1] WO9425862A1, Dogan et al., "*Biosensor substrate for mounting bilayer lipid membrane containing a receptor*".
[2] EP1712909 (A1), US2007161101 (A1), WO2005071405, S. Takeuchi et al., "*Method of forming planar lipid double membrane for membrane protein analysis and apparatus therefore.*"
[3] US2006228402, EP1710578 (A1), Pohl et al. "*Techniques for forming a lipid bilayer membrane*"
[4] US2004120854A1, R. Pantoja, J. Heath, et al., "*Silicon-wafer based devices and methods for analyzing biological materials*"; R. Pantoja, J. Heath, et al. *Biophys. J,* 2001, 81, 2389-2394.
[5] Olgier et al. Langmuir, "*Suspended Planar Phospholipid Bilayers on Micromachined Supports*" 16, 2000 5696-5701.
[6] Olgier et al. Langmuir, "*Single Ion Channel Sensitivity in Suspended Bilayers on Micromachined Supports*" 17, 2001 1240-1242.
[7] WO2006119915A1, EP1721657A1, Harnack et al., "*A method of fabricating a polymeric membrane having at least one pore*".
[8] Mayer et al., *Biophys. J* "*Microfabricated Teflon Membranes for Low-Noise Recordings of Ion Channels in Planar Lipid Bilayers*", 2003, 85(4) 2684-2695.
[9] White et al., *Biophys. J.* "*Analysis of the Torus Surrounding Planar Lipid Bilayer Membranes*", 1972, 12,432-445.

The features of the present invention disclosed in the specification, the claims and/or in the accompanying drawings, may, both separately and in any combination thereof, be material for realizing the invention in various forms thereof.

The invention claimed is:

1. A method of fabricating a membrane having a tapered pore, said method comprising the steps:
    a) providing a substrate,
    b) depositing an anti-sticking layer on said substrate,
    c) depositing a first polymeric layer of a first polymeric material on said anti-sticking layer,
    d) introducing a first aperture into said first polymeric layer, said first aperture having a first diameter,
    e) depositing a second polymeric layer of a second polymeric material onto said first polymeric layer, which second polymeric layer is located on said first polymeric layer and wherein a part of said second polymeric material also extends into and fills said first aperture,
    f) introducing a second aperture into said second polymeric layer, said second aperture having a second diameter which is larger than said first diameter, said second aperture being aligned with said first aperture, such that said part of said second polymeric material, which extends into and fills said first aperture, becomes removed,
    g) repeating steps e) and f) n-times, thus generating a third, fourth, . . . (n+2)th polymeric layer having a third, fourth, . . . (n+2)th aperture in said third, fourth, . . . . (n+2)th polymeric layer, said third, fourth, . . . (n+2)th aperture having a third, fourth, . . . (n+2)th diameter which is increasingly larger with increasing n, n being an integer from 0 to 10,
    said method thus resulting in a polymeric membrane on an anti-sticking layer and a substrate, said polymeric membrane having a tapered pore comprising (n+2) apertures of increasing diameter, said (n+2) apertures being aligned with each other to form said tapered pore.

2. The method according to claim 1, wherein said (n+2) apertures are concentrically aligned.

3. The method according to claim 1, wherein said first diameter is in the range from 1 nm to 100 μm, preferably from 1 nm to 10 μm.

4. The method according to claim 1, wherein said first polymeric layer has a height in the range from 0.3 nm to 20 μm, preferably 0.3 nm to 2 μm, and wherein said second and, if present, third, fourth, . . . (n+2)th polymeric layer has a height in the range from 500 nm to 1 mm, preferably 5 μm to 50 μm.

5. The method according to claim 1, wherein the ratio of said first diameter: height of said first polymeric layer is >3.

6. The method according to claim 1, wherein said substrate is made of a material selected from the group comprising glass, silicon, silicon oxide, silicon nitride, GaAs, saphire, polycarbide, and polycarbonate.

7. The method according to claim 1, wherein said anti-sticking layer is made of a material which is a metal with a weak adhesion to the substrate and has a thickness in the range from 10 nm to 100 nm.

8. The method according claim 1, wherein said first, second and, if present, third, fourth, . . . (n+2)th polymeric material is, independently, at each occurrence, selected from the group comprising of resists for optical lithography, electron beam lithography, and imprint lithography.

9. The method according to claim 1, wherein step b) occurs by a method selected from evaporation, sputtering, e-gun evaporation, gas-phase-deposition, sublimation, or electrochemical deposition.

10. The method according to claim 1, wherein steps c) and e) are independently performed by a method selected from spin coating, dip coating, spray coating, vacuum deposition, Langmuir Blodgett techniques, or deposition from the gas-phase.

11. The method according to claim 1, wherein steps d) and f) are independently performed by a method selected from optical lithography, electron beam lithography, imprint lithography, and focused ion beam etching.

12. The method according to claim 1, wherein in steps d) and f), a plurality of first and second apertures are introduced.

13. The method according to claim 8, wherein said resists for optical lithography, electron beam lithography and imprint lithography are selected from the group comprising negative and positive tone resists for optical lithography, electron beam lithography and imprint lithography.

14. The method according to claim 1, further comprising the step:
   h) removing said substrate by peeling off said polymeric membrane on and together with said anti-sticking layer from said substrate.

15. The method according to claim 14, further comprising the step:
   i) removing said anti-sticking layer by dry etching, or wet chemical etching.

16. The method according to claim 1, further comprising the step:
   i') introducing an aperture into said anti-sticking layer by dry etching, or wet chemical etching, and using said first polymeric layer as an etching mask.

17. The method according to claim 1, further comprising the step:
   h') selectively etching said polymeric membrane on said anti-sticking layer and said substrate by using dry plasma etching, or chemical wet etching, to reduce the total thickness of said polymeric membrane, and, optionally, removing said substrate by peeling off said polymeric membrane on and together with said anti-sticking layer from said substrate.

18. The method according to claim 16, further comprising the step: k) selectively etching said polymeric membrane on said anti-sticking layer and, if present, on said substrate, by using dry plasma etching, or chemical wet etching, to reduce the total thickness of said polymeric membrane, and, optionally, removing said substrate, if present, by peeling off said polymeric membrane on and together with said anti-sticking layer from said substrate.

19. The method according claim 14, wherein, after removal of said substrate, said polymeric membrane and/or, if present, said anti-sticking layer is/are further surface modified by a method selected from
   a) immobilizing functional groups or molecules thereon to match the surface properties of a lipid bilayer to be introduced into said first aperture or into said aperture in said anti-sticking layer,
   b) surface activation by introducing OH-groups through $O_2$-plasma treatment
   c) enhancing the surface roughness by etching,
   d) deposition of one or several functional layers, e.g. by dip coating, gas-phase deposition or evaporation, and any combination of steps a)-d).

20. The method according to claim 19, wherein said functional layer is selected from fluorosilanes, alkylsilanes, or fluorinated plasma components from $CHF_3$, or $CF_4$.

21. The method according to claim 15 or 16, wherein said wet chemical etching is $KI/I_2$-etching to remove gold, or etching using a strong base to remove aluminum, and wherein said dry etching is dry argon-etching.

22. The method according to claim 17 or 18, wherein said dry plasma etching is $O_2$ plasma etching, and wherein said chemical wet etching is oxidation in $H_2SO_4/H_2O_2$.

23. The method according to claim 19, wherein said etching is Ar, $CHF_3$, $CF_4$, or $O_2$-plasma etching or combinations thereof.

* * * * *